US010435784B2

United States Patent
Sheelavant et al.

(10) Patent No.: US 10,435,784 B2
(45) Date of Patent: Oct. 8, 2019

(54) THERMALLY OPTIMIZED RINGS

(71) Applicant: Applied Materials, Inc., Santa Clara, CA (US)

(72) Inventors: Gangadhar Sheelavant, Karnataka (IN); Cariappa Achappa Baduvamanda, Bangalore (IN); Bopanna Ichettira Vasantha, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 419 days.

(21) Appl. No.: 15/233,613

(22) Filed: Aug. 10, 2016

(65) Prior Publication Data

US 2018/0044783 A1 Feb. 15, 2018

(51) Int. Cl.
| | |
|---|---|
| *H01L 21/326* | (2006.01) |
| *C23C 16/00* | (2006.01) |
| *C23C 14/50* | (2006.01) |
| *H01J 37/32* | (2006.01) |

(Continued)

(52) U.S. Cl.
CPC .............. *C23C 14/50* (2013.01); *C23C 14/34* (2013.01); *H01J 37/321* (2013.01); *H01J 37/32477* (2013.01); *H01J 37/32623* (2013.01); *H01J 37/32633* (2013.01); *H01J 37/32642* (2013.01); *H01J 37/32651* (2013.01); *H01J 37/34* (2013.01); *H01J 37/3447* (2013.01)

(58) Field of Classification Search
CPC .................. H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H01J 37/32623; H01J 37/32633; H01J 37/32642; H01J 37/32651; H01L 21/687; H01L 21/68721; H01L 21/68735
See application file for complete search history.

(56) References Cited

U.S. PATENT DOCUMENTS

| | | | | |
|---|---|---|---|---|
| 5,685,914 A | * | 11/1997 | Hills ................. | H01J 37/32449 |
| | | | | 118/723 E |
| 5,891,350 A | * | 4/1999 | Shan ................. | H01J 37/32477 |
| | | | | 118/723 E |

(Continued)

OTHER PUBLICATIONS

PCT/US2017/042493, International Search Report, dated Nov. 2, 2017, 13 pages.

*Primary Examiner* — Luz L Alejandro Mulero
(74) *Attorney, Agent, or Firm* — Patterson + Sheridan LLP

(57) ABSTRACT

A process kit ring for use in a plasma processing system is disclosed herein. The process kit ring includes an annular body and one or more hollow inner cavities. The annular body is formed from a plasma resistant material. The annular body has an outer diameter greater than 200 mm. The annular body includes a top surface and a bottom surface. The top surface is configured to face a plasma processing region of a process chamber. The bottom surface is opposite the top surface. The bottom surface is substantially perpendicular to a centerline of the body. The bottom surface is supported at least partially by a pedestal assembly. The one or more hollow inner cavities are formed in the annular body about the centerline. The one or more hollow inner cavities are arranged in a circle within the annular body.

20 Claims, 9 Drawing Sheets

(51) Int. Cl.
 *C23C 14/34* (2006.01)
 *H01J 37/34* (2006.01)

(56) References Cited

U.S. PATENT DOCUMENTS

| | | | |
|---|---|---|---|
| 6,206,976 B1* | 3/2001 | Crevasse | C23C 16/45521 118/500 |
| 2006/0138925 A1 | 6/2006 | Cheng et al. | |
| 2007/0102286 A1* | 5/2007 | Scheible | C23C 14/3407 204/298.01 |
| 2007/0228302 A1 | 10/2007 | Norman | |
| 2008/0038481 A1 | 2/2008 | West et al. | |
| 2009/0173389 A1* | 7/2009 | Fischer | C23C 16/45523 137/2 |
| 2010/0243608 A1* | 9/2010 | Koshimizu | H01J 37/32091 216/67 |
| 2010/0300623 A1* | 12/2010 | Motokawa | G03F 1/46 156/345.51 |
| 2012/0103257 A1* | 5/2012 | Rasheed | C23C 14/50 118/715 |
| 2013/0256962 A1* | 10/2013 | Ranish | B05C 13/00 269/11 |
| 2015/0170884 A1 | 6/2015 | Ouye | |
| 2016/0071706 A1 | 3/2016 | Kerschbaumer | |
| 2016/0155657 A1* | 6/2016 | Gopalan | H01L 21/68735 428/600 |
| 2016/0181142 A1 | 6/2016 | Raj et al. | |
| 2017/0162422 A1* | 6/2017 | Raj | H01L 21/68721 |

\* cited by examiner

THERMALLY OPTIMIZED RINGS

BACKGROUND

Field

Embodiments described herein generally relate to a processing chamber, and more specifically, to component rings of a processing chamber.

Description of the Related Art

Physical vapor deposition (PVD) is one of the most commonly used processes in the fabrication of electronic devices. PVD is a plasma process performed in a vacuum chamber where negatively biased target is exposed to a plasma of an inert gas having relatively heavy atoms (e.g., argon) or a gas mixture comprising such inert gas. Bombardment of the target by ions of the inert gas results in ejection of atoms of the target material. The ejected atoms accumulate as a deposited film on a substrate placed on a substrate support disposed in the chamber.

A process kit may be disposed in the chamber to help define a processing region in a desired region within the chamber with respect to the substrate. The process kit may include at least a cover ring and a deposition ring. The deposition ring may be configured to prevent deposition on the perimeter of the substrate support pedestal. The cover ring may be configured to create a gap between the deposition ring to prevent deposition below the substrate. During processing, the deposition ring and the cover ring may be heated to high temperatures. The high temperature results in thermal expansion of the deposition ring and the cover ring, which, over time, decreases the life of the deposition ring and the cover ring.

Therefore, there is a need for improved process kits for a processing chamber.

SUMMARY

In one embodiment, a process kit ring for use in a plasma processing system is disclosed herein. The process kit ring includes an annular body and one or more hollow inner cavities. The annular body is formed from a plasma resistant material. The annular body has an outer diameter greater than 200 mm. The annular body includes a top surface and a bottom surface. The top surface is configured to face a plasma processing region of a process chamber. The bottom surface is opposite the top surface. The bottom surface is substantially perpendicular to a centerline of the body. The bottom surface is supported at least partially by a pedestal assembly. The one or more hollow inner cavities are formed in the annular body about the centerline. The one or more hollow inner cavities are arranged in a circle within the annular body.

In another embodiment, a process kit for a substrate processing chamber is disclosed herein. The process kit includes a first process kit ring and a second process kit ring. The first process kit includes a first body and one or more first hollow inner cavities. The first body is formed from a plasma resistant material. The first body has a first outer diameter greater than 200 mm. The first body includes a first top surface and a first bottom surface. The first top surface faces a plasma processing region of a process chamber. The first top surface is configured to at least partially support a second process kit ring. The first bottom surface is opposite the first top surface. The first bottom surface is substantially perpendicular to a first centerline of the first body and supported at least partially by a pedestal assembly. The second process kit ring at least partially covers the first process kit ring. The second process kit ring includes a second body and one or more second hollow inner cavities. The second body is formed from a second plasma resistant material. The second body includes a second outer diameter greater than 200 mm. The second body includes a second top surface and a second bottom surface. The second top surface faces the plasma processing region of the processing chamber. The second bottom surface is opposite the second top surface. The second bottom surface is substantially parallel to a second centerline of the second process kit ring. The second bottom surface is configured to at least partially cover the first process kit ring. The one or more second hollow inner cavities are formed in the second body about the centerline. The one or more second hollow inner cavities are arranged in a circle within the second body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
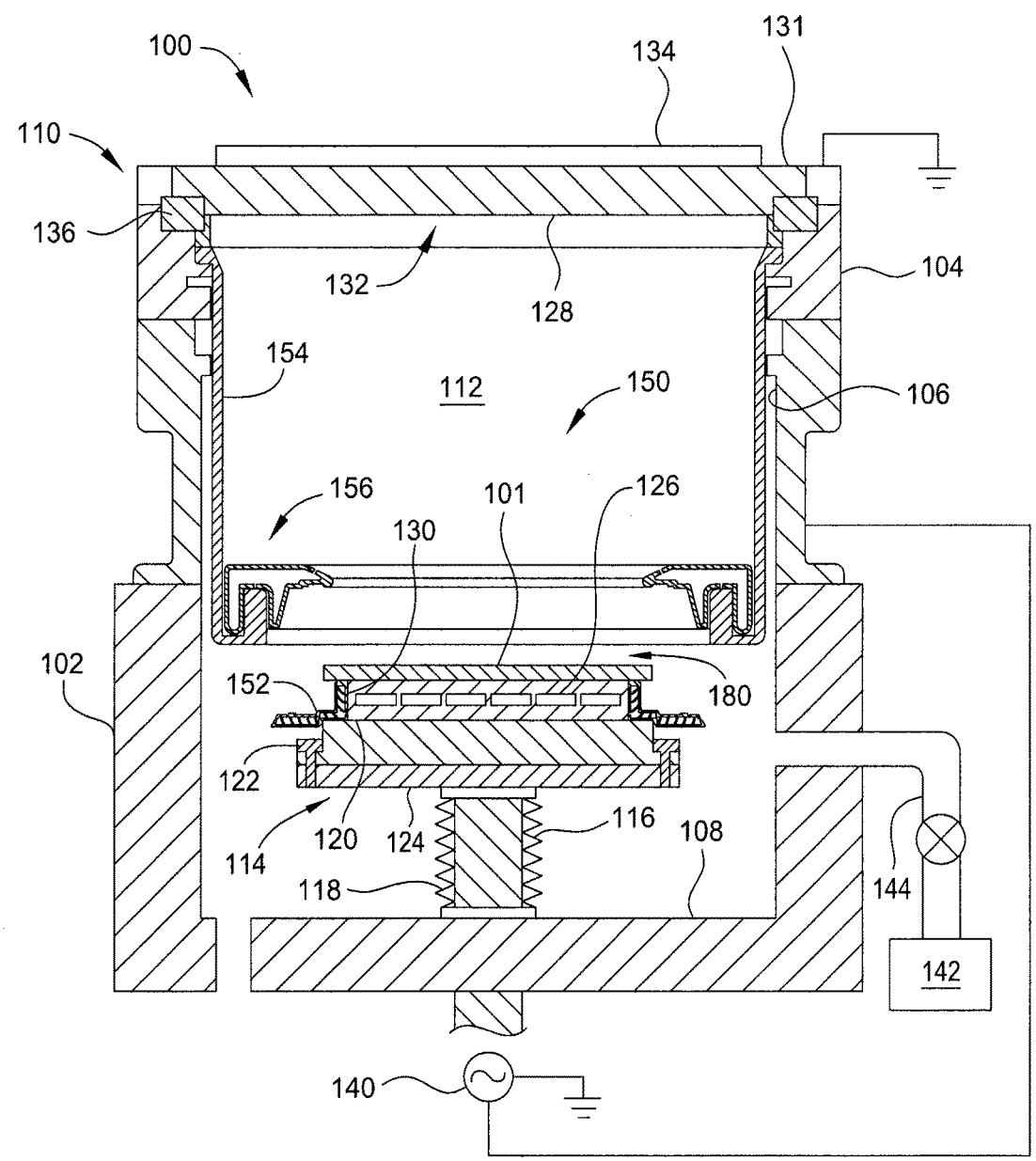
FIG. 1 illustrates an exemplary semiconductor processing chamber, according to one embodiment.

FIG. 1 illustrates an exemplary semiconductor processing chamber 100, according to one embodiment. As shown, the processing chamber 100 is a physical vapor deposition (PVD) chamber, capable of depositing metal or ceramic materials, such as for example, titanium, aluminum oxide, aluminum, copper, tantalum, tantalum nitride, tantalum carbide, tungsten, tungsten nitride, lanthanum, lanthanum oxides, titanium nitride, nickel, and NiPt, among others. One example of a processing chamber that may be adapted to benefit from the disclosure is the ALPS® Plus and SIP ENCORE® PVD processing chambers, commercially available from Applied Materials, Inc. of Santa Clara, Calif. It is contemplated that other processing chambers including those from other manufacturers may be adapted to benefit from the disclosure.

The processing chamber 100 includes a chamber body 102 having upper adapters 104, lower adapters 106, a bottom 108, and a lid assembly 110 that encloses an interior volume 112. The chamber bottom 106 generally includes a slit valve (not shown) to provide entry and egress of a substrate 101 from the processing chamber 100.

The semiconductor processing chamber 100 includes a pedestal assembly 114 and a process kit 150. The pedestal assembly 114 may be supported from the bottom 108 of the chamber 100. The process kit 150 includes at least a deposition ring 152 supported on the pedestal assembly 114. The process kit 150 may also include one or both of a ground shield 154 and an interleaving cover ring 156. The pedestal assembly 114 is coupled to the bottom 106 of the chamber 100 by a lift mechanism 116 that is configured to move the pedestal assembly 114 between an upper and lower position. In the lower position, lift pins (not shown) are moved through the pedestal assembly 114 to space the substrate from the pedestal assembly 114 to facilitate exchange of the substrate with a substrate transfer mechanism disposed exterior to the processing chamber. A bellows 118 may be disposed between the pedestal assembly 114 and the bottom 108 to isolate the interior volume 112 of the chamber body 102 from the interior of the pedestal assembly 114 and the exterior of the chamber 100.

The pedestal assembly 114 generally includes a substrate support 120 sealingly coupled to a base plate 122, which is coupled to a ground plate 124. The substrate support 120 may be comprised of aluminum or ceramic. The substrate support 120 may be an electrostatic chuck, a ceramic body, a heater, or a combination thereof. The dielectric body may be fabricated from a high thermal conductivity dielectric material, such as pyrolytic boron nitride, aluminum nitride, silicon nitride, or the like. The substrate support 120 has a substrate receiving surface 126 that receives and supports the substrate 101 during processing. The substrate receiving surface 126 has a plane substantially parallel to a sputtering surface 128 of the target 132.

The process kit 150 comprises various components that can be easily removed from the chamber 100, for example, to clean sputtering deposits off the component surfaces, replace or repair eroded components, or to adapt the chamber 100 for other processes. As discussed above, the process kit 150 includes at least one or more of the deposition ring 152, the ground shield 154 and the cover ring 156. In one embodiment, the cover ring 156 and deposition ring 152 are placed about a peripheral edge 130 of the substrate support 120. The deposition ring 152 and cover ring 156 are discussed in more detail in FIGS. 2-7. The deposition ring 152 and cover ring 156 may be formed from a 3D printing, lithography, or casting process, which allows one or more hollow inner cavities to be formed in the bodies of the deposition ring 152 and cover ring 156. This results in an increased surface area (including internal surfaces) for the deposition ring 152 and cover ring 156, which advantageously results in up to a 30% decrease in thermal expansion when the deposition ring 152 and cover ring 156 are heated.

The lid assembly 110 generally includes a target backing plate 131, a target 132, and a magnetron 134. The target backing plate 131 is supported by the upper adapters 104 when in a closed position. A ceramic ring seal 136 may be disposed between the target backing plate 131 and upper adapters 104 to prevent vacuum leakage therebetween. The target 132 is coupled to the target backing plate 131 and exposed to the interior volume 112 of the processing chamber 100. The target 132 provides material which is deposited on the substrate 101 during a PVD process.

The process chamber 100 is coupled to a power source 140 and a gas source 142. A gas, such as argon, may be supplied to the interior volume 112 from the gas source 142 via conduits 144. The gas source 142 may comprise a non-reactive gas such as argon or xenon, which is capable of energetically impinging upon and sputtering material from the target 132. The gas source 142 may also include a reactive gas. A plasma is formed between the substrate 101 and the target 132, defined as the plasma processing region 180. Ions within the plasma are accelerated toward the target 132 and cause material to become dislodged from the target 132. The dislodged target material is deposited on the substrate 101.

Figure 2A:
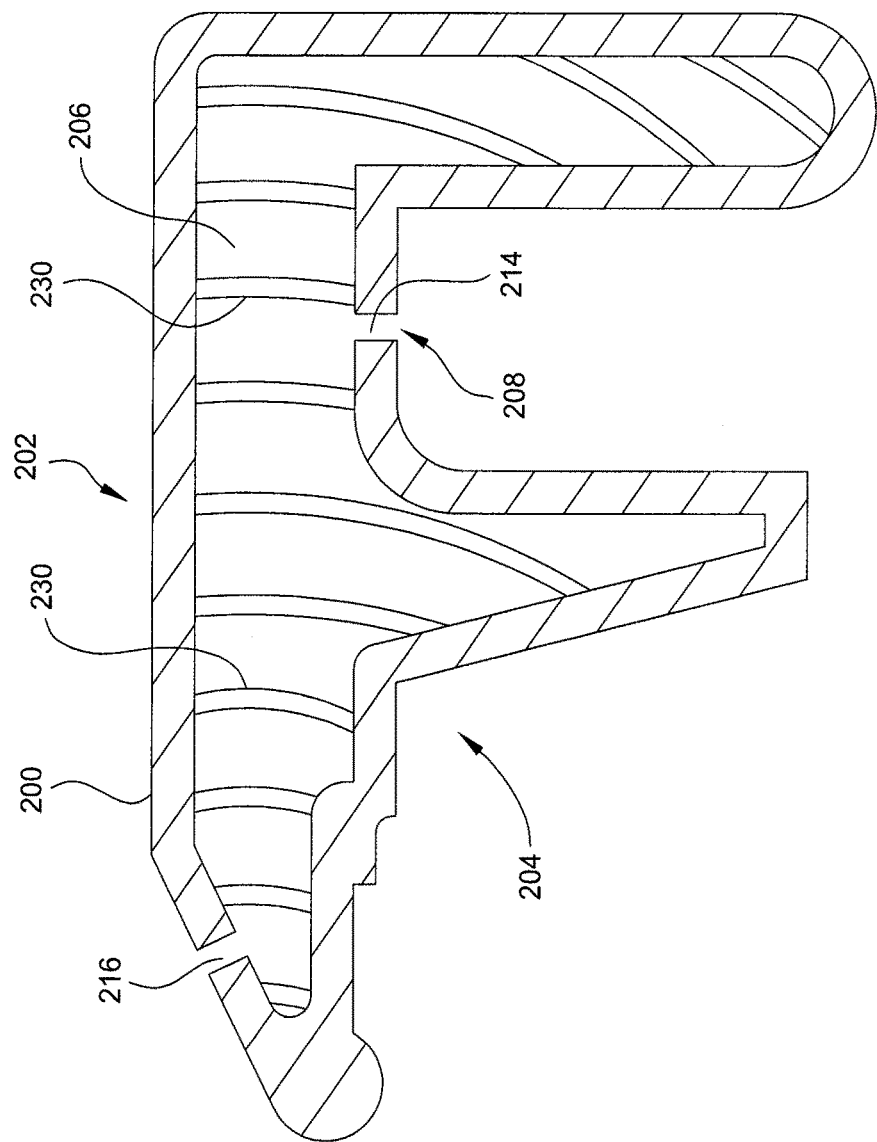
FIG. 2A is a cross-sectional view illustrating the cover ring of FIG. 1, according to one embodiment.
Figure 2B:
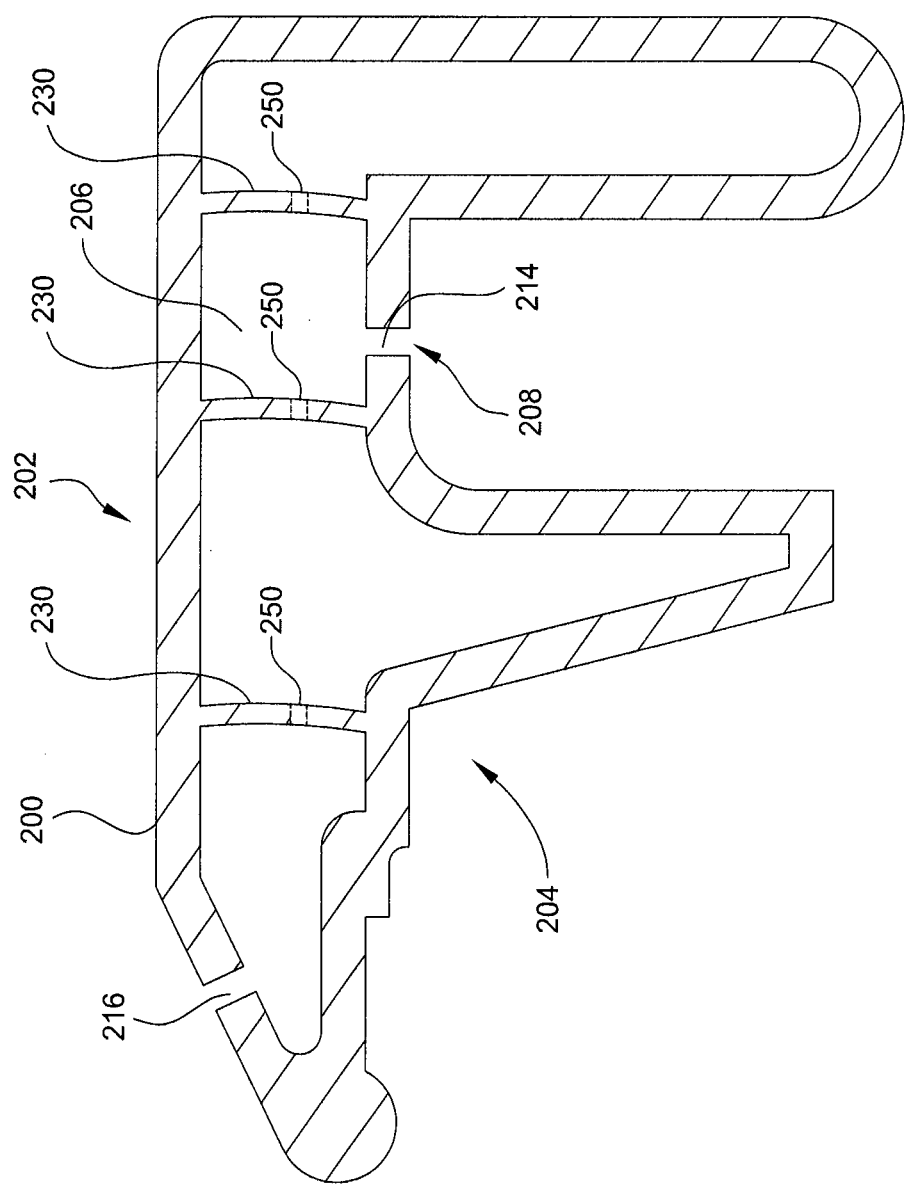
FIG. 2B is a cross-sectional view illustrating the cover ring of FIG. 1, according to another embodiment.

FIGS. 2A and 2B are a cross-sectional view illustrating the cover ring 156, according to one embodiment. The cover ring 156 includes an annular body 200. The annular body 200 is formed from a plasma resistant material. For example, the annular body 200 is formed from stainless steel. In one embodiment, the annular body 200 may be formed through a three-dimensional (3D) printing or other suitable process. The annular body 200 includes a top surface 202 and a bottom surface 204. The top surface 202 faces the plasma processing region of the process chamber 100. In one embodiment, the top surface 202 may include a three-dimensionally printed surface texture. The bottom surface 204 is perpendicular to a centerline 210 of the body 200. In one embodiment, the bottom surface 204 is substantially flat. The bottom surface 204 is configured to at least partially cover the deposition ring 152.

The cover ring 156 further comprises one or more hollow inner cavities 206 and one or more vent holes 208. The 3D printing process allows for the one or more hollow inner cavities 206 and the one or more vent holes 208 to be formed in the annular body 200. The one or more hollow inner cavities 206 are formed in the annular body 200. In one embodiment, the one or more hollow inner cavities 206 are formed in a circle about a centerline 210 of the body 22. For example, the one or more hollow inner cavities 206 may be concentric about the centerline 210 of the annular body 200. The one or more hollow inner cavities 206 are configured to provide a greater surface area for heat to radiate when the cover ring 156 is heated during processing. The greater surface area aids in reducing the overall thermal strain of the cover ring 156. In one example, the one or more hollow inner cavities 206 results in up to a 30% decrease in thermal expansion. By reducing the thermal expansion of the cover ring 156, the lifetime of the cover ring 156 is increased, thus increasing the number of substrates processed before having to be replaced. Additionally, the reduction in thermal expansion results in less rubbing of the cover ring 156 against other chamber components, which reduces particle generation in the process chamber 100. In one embodiment, one or more internal features 230 may be formed in the one or more hollow inner cavities 206. For example, one or more internal features 230 in the form of ribs or fins may be formed in the one or more hollow inner cavities. The one or more internal features 230 are configured to increase the rigidity of the cover ring 156. When the one or more internal features 230 extend through the one or more hollow inner cavities 206 (such as that shown in FIG. 2B), an optional hole 250 may be formed in each of the one or more internal features. The optional holes are configured to vent areas formed in the one or more hollow inner cavities 206 by the one or more internal features 230.

The one or more vent holes 208 are formed in the annular body 200. The one or more vent holes 208 are in fluid communication with the one or more hollow inner cavities 206. The one or more vent holes 208 are configured to vent the hollow inner cavities 206. In one embodiment, the one or more vent holes 208 have an open area of about 3.14 $mm^2$. Venting the hollow inner cavities 206 ensures that pressure will not build up in the hollow inner cavities 206 and distort the cover ring 156. Generally, the one or more vent holes 208 may be formed in the annular body 200 on an exterior surface that is not facing the plasma processing region (e.g., not on the top surface). In one embodiment, the cover ring 156 may include a first vent hole 214 and a second vent hole 216, the first vent hole 214 formed on an opposite side of the body 200 relative to the second vent hole 216. Positioning the first and second vent holes 214, 216 at opposite sides of the body 200 allows any dust or other contaminant to be removed by blowing air into the first vent hole 214 such that the dust exits the hollow inner cavities 206 through the second vent hole 216.

Figure 3:
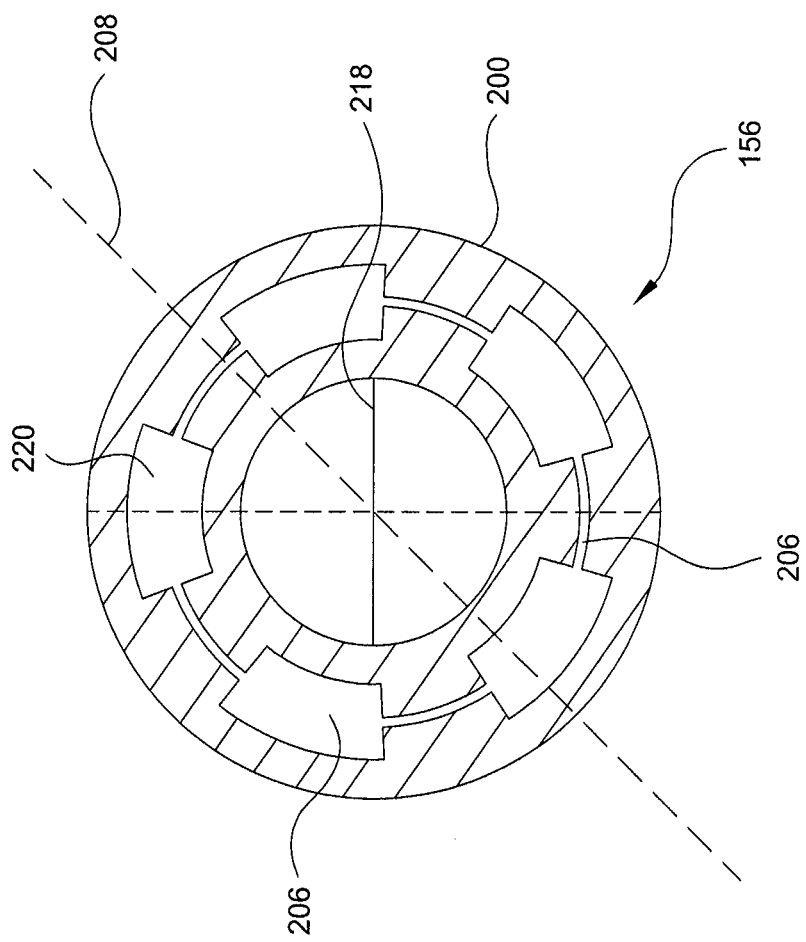
FIG. 3 illustrates a top cross-sectional view of the cover ring of FIG. 2, according to one embodiment.

FIG. 3 illustrates a top cross-sectional view of the cover ring 156 of FIG. 2, according to one embodiment. As shown, the cover ring 156 includes an inner diameter 218 and an outer diameter 220. The inner diameter 218 is shorter than the outer diameter 220. The cover ring 156 is shown with one or more hollow inner cavities 206 formed therein. The one or more hollow inner cavities 206 are formed about the centerline 211 of the cover ring 156. In one embodiment, the one or more hollow inner cavities 206 are all interconnected. Interconnecting the one or more hollow inner cavities 206 allows for uniform pressure throughout the cover ring 156.

Figure 4:
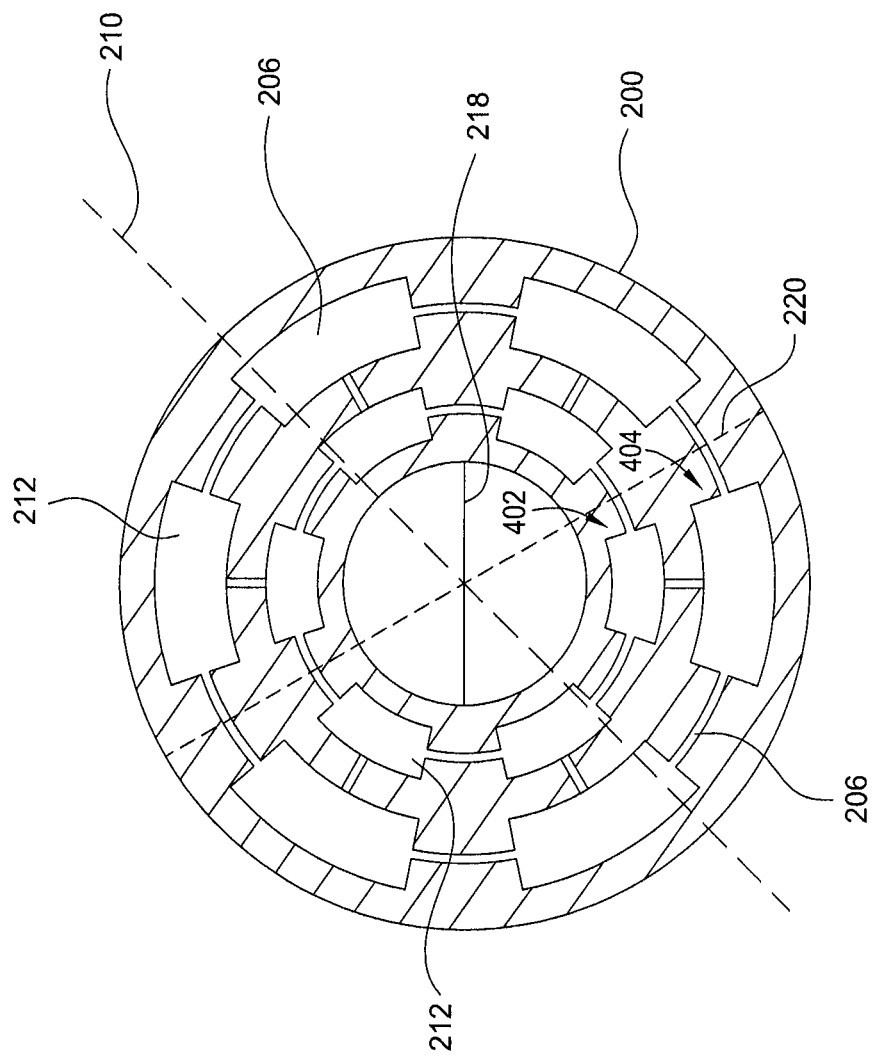
FIG. 4 illustrates a top view cross-sectional view of the cover ring of FIG. 1, according to one embodiment.

FIG. 4 illustrates a top cross-sectional view of the cover ring 156, according to another embodiment. As shown, the cover ring 156 includes a first row 402 and a second row 404 of hollow inner cavities 206 formed therein. The hollow inner cavities 206 of the first row 402 and the hollow inner cavities of the second row are formed about the centerline 211 of the cover ring 156. In one embodiment, the hollow inner cavities 206 of the first row 402 are interconnected along the first row 402 and the hollow inner cavities 206 of the second row 404 are interconnected along the second row 404. In another embodiment, the hollow inner cavities 206 are interconnected across the first and second rows 402, 404 as well.

Figure 5A:
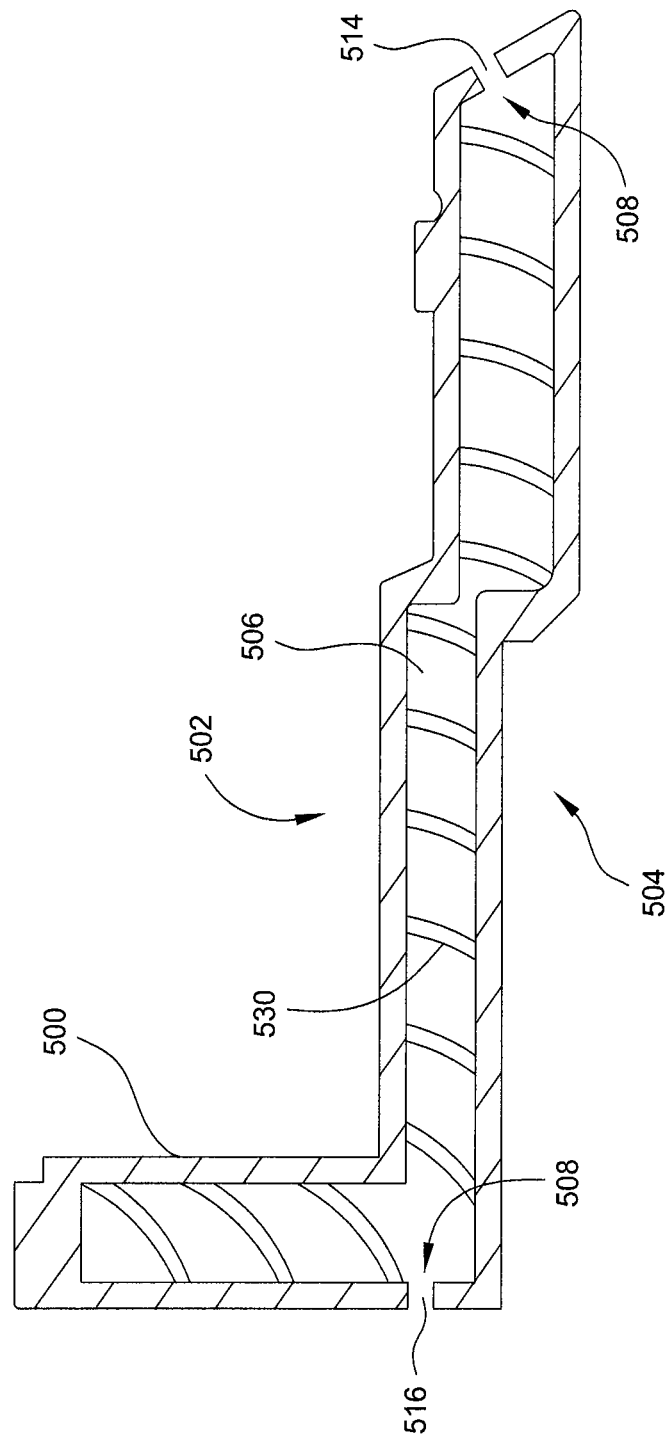
FIG. 5A is a cross-sectional view illustrating the deposition ring of FIG. 1, according to one embodiment.
Figure 5B:
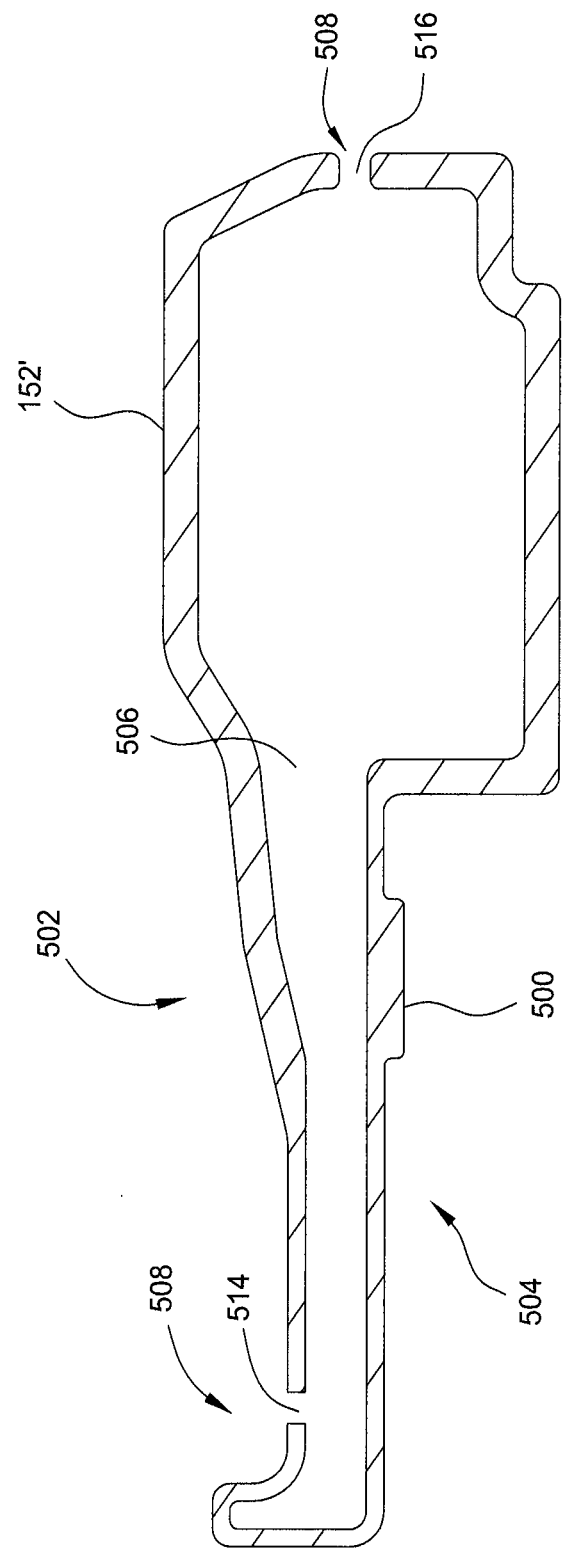
FIG. 5B is a cross-sectional view illustrating the deposition ring of FIG. 1, according to another embodiment.

FIGS. 5A and 5B are a cross-sectional views illustrating the deposition ring 152 and deposition ring 152', according to one embodiment. Deposition ring 152' may be used in place of deposition ring 152 in processing chamber 100. Deposition ring 152' is substantially similar to deposition ring 152. The deposition ring 152 includes an annular body 500. The annular body 500 may be formed from a plasma resistant material. For example, the annular body 500 may be formed from stainless steel. In one embodiment, the annular body 500 may be formed through a three-dimensional (3D) printing or other suitable process. The annular body 500 includes a top surface 502 and a bottom surface 504. The top surface 502 faces the plasma processing region 180 of the process chamber 100. The top surface 502 is configured to at least partially support the body 500. In one embodiment, the top surface 502 may include a three-dimensionally printed surface texture. The bottom surface 504 is perpendicular to a centerline 510 of the deposition ring 152. In one embodiment, the bottom surface 504 is substantially flat. The bottom surface 504 is configured to be at least partially supported by the substrate support 120.

The deposition ring 152 further comprises one or more hollow inner cavities 206 and one or more vent holes 508. The 3D printing process allows for the one or more hollow inner cavities 506 and the one or more vent holes 508 to be formed in the body 500. The one or more hollow inner cavities 506 are formed in the annular body 500. In one embodiment, the one or more hollow inner cavities 506 are formed in a circle about a centerline 510 of the body 500. For example, the one or more hollow inner cavities 506 may be concentric about the centerline 510 of with the annular body 500. The one or more hollow inner cavities 506 are configured to provide a greater surface area for heat to radiate when the deposition ring 152 is heated during processing. The greater surface area aids in reducing the overall thermal strain of the deposition ring 152. In one example, the one or more hollow inner cavities 506 results in up to a 30% decrease in thermal expansion. By reducing the thermal expansion of the deposition ring 152, the lifetime of the deposition ring 152 is increased, thus increasing the number of substrates processed before having to be replaced. Additionally, the reduction in thermal expansion results in less rubbing of the deposition ring 152 against other components, which reduces particle generation in the process chamber 100. In one embodiment, one or more internal features 530 may be formed in the one or more hollow inner cavities 506. For example, one or more internal features 530 in the form of ribs or fins may be formed in the one or more hollow inner cavities. The one or more internal features 530 are configured to increase the rigidity of the deposition ring 152.

The one or more vent holes 508 are in fluid communication with the one or more hollow inner cavities 506. The one or more vent holes 508 are configured to vent the hollow inner cavities 506. In one embodiment, the one or more vent holes 508 have an open area of about 3.14 $mm^2$. Venting the hollow inner cavities 506 ensures that pressure will not build up in the hollow inner cavities 506 and distort the deposition ring 152. Generally, the one or more vent holes 508 may be formed in the annular body 500 on an exterior surface that is not facing the plasma processing region (e.g., not on the top surface). In one embodiment, the deposition ring 152 may include a first vent hole 514 and a second vent hole 516, the first vent hole 514 formed on an opposite side of the body 500 relative to the second vent hole 516. Positioning the first and second vent holes 514, 516 at opposite sides of the body 500 allows any dust or other contaminants to be removed by blowing air into the first vent hole 514 such that the dust exits the hollow inner cavities 506 through the second vent hole 516.

FIG. 5 is a cross-sectional view illustrating the deposition ring 152', according to another embodiment. Deposition ring 152' may be used in place of deposition ring 152 in processing chamber 100.

Figure 6:
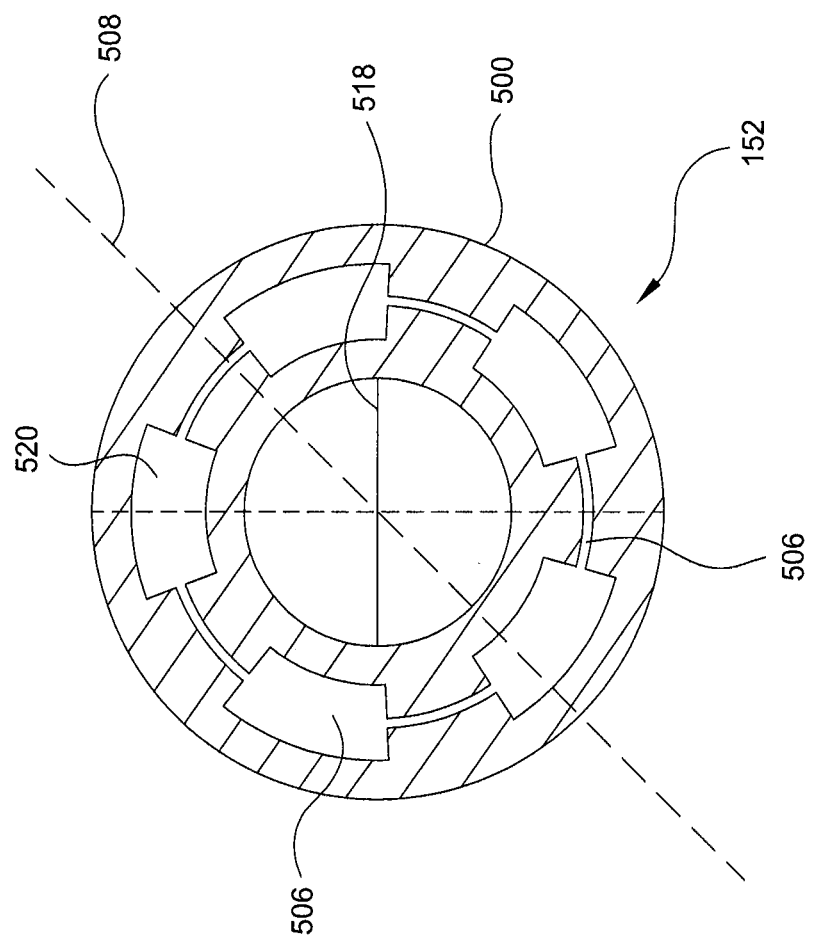
FIG. 6 illustrates a top cross-sectional view of the deposition ring of FIG. 5, according to one embodiment.

FIG. 6 illustrates a top cross-sectional view of the deposition ring 152 of FIG. 2, according to one embodiment. As shown, the deposition ring 152 includes an inner diameter 518 and an outer diameter 520. The inner diameter 518 is shorter than the outer diameter 520. The deposition ring 152 is shown with one or more hollow inner cavities 506 formed therein. The one or more hollow inner cavities 506 are formed about the centerline 511 of the deposition ring 152. In one embodiment, the one or more hollow inner cavities 506 are all interconnected. Interconnecting the one or more hollow inner cavities 506 allows for uniform pressure throughout the deposition ring 152.

Figure 7:
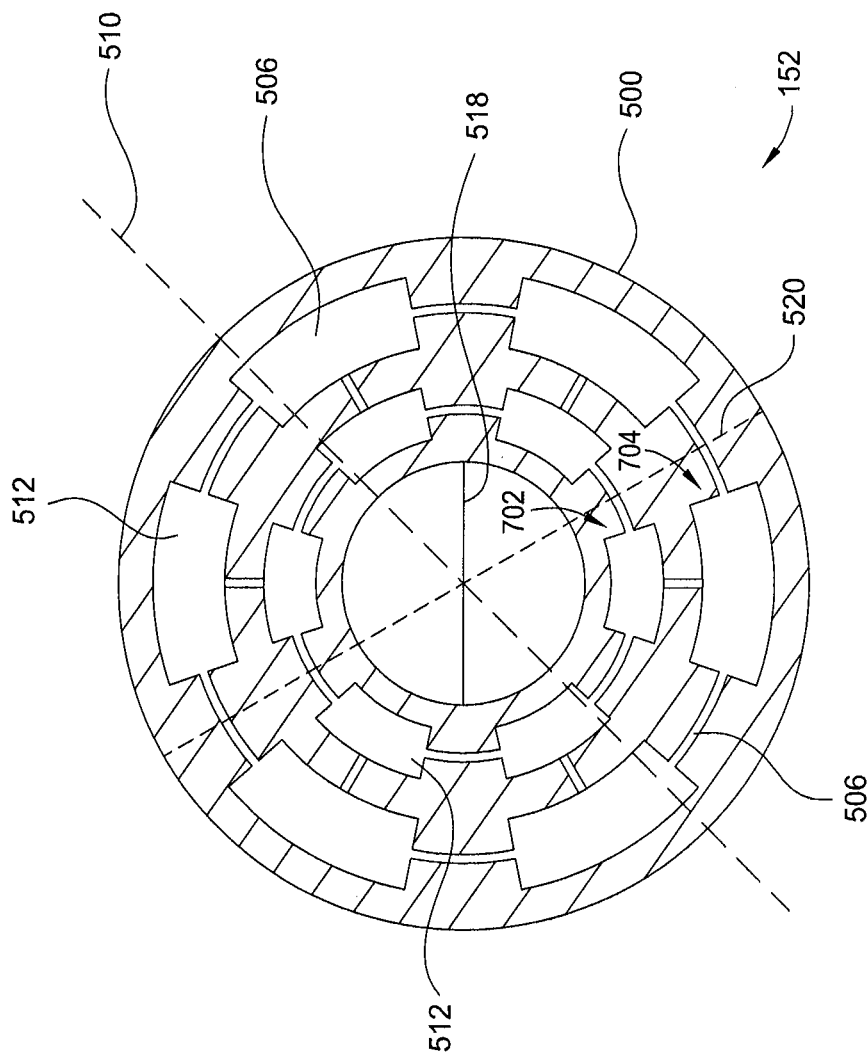
FIG. 7 illustrates a top view cross-sectional view of the deposition ring of FIG. 1, according to one embodiment.

FIG. 7 illustrates a top cross-sectional view of the cover ring 156, according to another embodiment. As shown, the cover ring 156 includes a first row 702 and a second row 704 of hollow inner cavities 506 formed therein. The hollow inner cavities 506 of the first row 702 and the hollow inner cavities of the second row are formed about the centerline 511 of the cover ring 156. In one embodiment, the hollow inner cavities 506 of the first row 702 are interconnected along the first row 702 and the hollow inner cavities 506 of the second row 704 are interconnected along the second row 704. In another embodiment, the hollow inner cavities 506 are interconnected across the first and second rows 702, 704 as well.

While the foregoing is directed to specific embodiments, other and further embodiments may be devised without departing from the basic scope thereof, and the scope thereof is determined by the claims that follow.

What is claimed is:

1. A process kit ring for use in a plasma processing system, the process kit ring, comprising:
   an annular body formed from a plasma resistant material, the annular body having an outer diameter greater than 200 mm, the annular body comprising:
      a top surface; and
      a bottom surface opposite the top surface, the bottom surface substantially perpendicular to a centerline of the annular body;
   one or more hollow inner cavities formed in the annular body about the centerline and at least partially defined by the top surface and the bottom surface, the one or more hollow inner cavities arranged in a circle within the annular body;
   one or more features formed in the one or more hollow inner cavities, the one or more features extending from the top surface to the bottom surface and further defining the one or more hollow inner cavities, the one or more features comprising ribs or fins;
   a first vent hole formed in the annular body and in fluid communication with at least one of the one or more hollow inner cavities; and
   a second vent hole formed in the annular body and in fluid communication with at least one of the one or more hollow inner cavities, the second vent hole formed on an opposite surface of the annular body relative to the first vent hole.

2. The process kit ring of claim 1, wherein each of the one or more hollow inner cavities are arranged in one or more annular rows about the centerline.

3. The process kit of claim 2, wherein the one or more hollow inner cavities in each annular row are in fluid communication with each other.

4. The process kit ring of claim 1,
   wherein the first and second vent holes are shielded from the plasma processing region.

5. The process kit ring of claim 4, wherein each of the first and second vent holes have an area of about 3.14 mm$^2$.

6. The process kit ring of claim 1, wherein the annular body and the one or more hollow inner cavities are formed by a three-dimensional printing process.

7. The process kit ring of claim 1, wherein the top surface includes a three-dimensionally printed surface texture.

8. The process kit ring of claim 1, wherein the bottom surface is configured to be supported by a pedestal assembly and the top surface is configured to be at least partially supported by a cover ring.

9. The process kit ring of claim 1, wherein the bottom surface is configured to be at least partially supported by a deposition ring.

10. The process kit ring of claim 1, wherein the annular body is formed from stainless steel.

11. A process kit for a substrate processing chamber, comprising:
    a first process kit ring, comprising:
       a first body formed from a first plasma resistant material, the first body having a first outer diameter greater than 200 mm, the first body comprising:
          a first top surface; and
          a first bottom surface opposite the first top surface, the first bottom surface substantially perpendicular to a first centerline of the first body;
       one or more first hollow inner cavities formed in the first body about the first centerline and at least partially defined by the first top surface and the first bottom surface, the one or more first hollow inner cavities arranged in a circle within the first body;
       one or more first ribs formed in the one or more first hollow inner cavities, the one or more first ribs extending from the first top surface to the first bottom surface and further defining the one or more first hollow inner cavities; and
       two or more first vent holes formed in the first body and in fluid communication with at least one of the one or more first hollow inner cavities, the two or more first vent holes formed on opposite surfaces of the first body relative to one another; and
    a second process kit ring at least partially covering the first process kit ring, the second process kit ring, comprising:
       a second body formed from a second plasma resistant material, the second body having a second outer diameter greater than 200 mm, the second body comprising:
          a second top surface; and
          a second bottom surface opposite the second top surface, the second bottom surface substantially parallel to a second centerline of the second process kit ring and configured to at least partially cover the first process kit ring;
       one or more second hollow inner cavities formed in the second body about the second centerline and at least partially defined by the second top surface and the second bottom surface, the one or more second hollow inner cavities arranged in a circle within the second body;
       one or more second ribs formed in the one or more second hollow inner cavities, the one or more second ribs extending from the second top surface to the second bottom surface and further defining the one or more second hollow inner cavities; and
       two or more second vent holes formed in the second body and in fluid communication with at least one of the one or more second hollow inner cavities, the two or more second vent holes formed on opposite surfaces of the second body relative to one another.

12. The process kit of claim 11, wherein the one or more first hollow inner cavities are arranged in one or more rows about the first centerline.

13. The process kit of claim 12, wherein each of the one or more first vent holes have an open area of about 3.14 mm$^2$.

14. The process kit of claim 11, wherein the one or more second hollow inner cavities are arranged in one or more rows about the second centerline.

15. The process kit of claim 14, wherein each of the one or more second vent holes have an open area of about 3.14 mm$^2$.

16. The process kit of claim 11, wherein the first process kit ring and the second process kit ring are formed by a three-dimensional printing process.

17. The process kit of claim 11, wherein the first process kit ring and the second process kit ring are formed from stainless steel.

18. The process kit of claim 11, wherein each of the one or more first hollow inner cavities are interconnected via a first set of holes formed in the one or more first ribs and each of the one or more second hollow inner cavities are interconnected via a second set of holes formed in the one or more second ribs.

19. The process kit of claim 11, wherein the first process kit ring further comprises:
    a three-dimensionally printed surface texture formed on the first top surface.

20. The process kit of claim 11, wherein the second process kit ring further comprises:
    a three-dimensionally printed surface texture formed on the second top surface.

\* \* \* \* \*

UNITED STATES PATENT AND TRADEMARK OFFICE
CERTIFICATE OF CORRECTION

PATENT NO.        : 10,435,784 B2            Page 1 of 1
APPLICATION NO.   : 15/233613
DATED             : October 8, 2019
INVENTOR(S)       : Gangadhar Sheelavant et al.

It is certified that error appears in the above-identified patent and that said Letters Patent is hereby corrected as shown below:

In the Claims

In Column 7, Line 48, in Claim 2, after "wherein" delete "each of".

Signed and Sealed this
Tenth Day of December, 2019

Andrei Iancu
*Director of the United States Patent and Trademark Office*